United States Patent
Abaziou et al.

(10) Patent No.: US 11,104,314 B2
(45) Date of Patent: Aug. 31, 2021

(54) SENSOR CIRCUIT COMPENSATION FOR SUPPLY VOLTAGE TRANSIENTS

(71) Applicant: NXP USA, Inc., Austin, TX (US)

(72) Inventors: Sébastien Abaziou, Tournefeuille (FR); Benoit Alcouffe, Tournefeuille (FR); Jean Christophe Patrick Rince, Roques (FR)

(73) Assignee: NXP USA, Inc., Austin, TX (US)

( * ) Notice: Subject to any disclaimer, the term of this patent is extended or adjusted under 35 U.S.C. 154(b) by 164 days.

(21) Appl. No.: 16/209,443

(22) Filed: Dec. 4, 2018

(65) Prior Publication Data

US 2020/0122700 A1    Apr. 23, 2020

(30) Foreign Application Priority Data

Oct. 23, 2018  (EP) .................................... 18306382

(51) Int. Cl.
| | |
|---|---|
| G01P 21/02 | (2006.01) |
| B60T 8/88 | (2006.01) |
| B60T 8/172 | (2006.01) |
| G01P 3/489 | (2006.01) |
| G01R 31/00 | (2006.01) |

(52) U.S. Cl.
CPC .............. B60T 8/885 (2013.01); B60T 8/172 (2013.01); G01P 3/489 (2013.01); G01R 31/006 (2013.01); *B60T 2270/416* (2013.01)

(58) Field of Classification Search
CPC . B60T 8/172; B60T 8/88; B60T 8/171; B60T 8/885; B60T 2270/416; G01P 3/489; G01P 21/02; G01R 31/00; G01R 31/006
USPC ........................................................ 324/177
See application file for complete search history.

(56) References Cited

U.S. PATENT DOCUMENTS

| | | | |
|---|---|---|---|
| 5,404,304 A | 4/1995 | Wise et al. | |
| 5,406,485 A | 4/1995 | Wise et al. | |
| 5,418,453 A | 5/1995 | Wise | |
| 5,880,614 A * | 3/1999 | Zinke .................... | G01P 3/48 327/205 |
| 6,446,018 B1 | 9/2002 | Isermann et al. | |

(Continued)

FOREIGN PATENT DOCUMENTS

| | | |
|---|---|---|
| DE | 4434180 A1 | 3/1996 |
| DE | 19812486 A1 | 9/1999 |

(Continued)

OTHER PUBLICATIONS

Littlefuse, Inc.; Suppression of Transients in an Automotive Environment; Application Note 9312; Jul. 1999; 12 pages; Chicago, IL.

*Primary Examiner* — Melissa J Koval
*Assistant Examiner* — Courtney G McDonnough

(57) ABSTRACT

A wheel speed sensor interface receives an analog signal from a wheel speed sensor and converts the analog signal to a digital wheel speed sensor output signal. A detector circuit is configured to detect a transient occurring within a voltage source powering the wheel speed sensor, and compensate the digital wheel speed sensor output signal as a function of the detection of the transient so that it is an accurate representation of a wheel speed detected by the wheel speed sensor. The detector circuit includes a current mirror coupled to the voltage source, and outputs a compensation current to a current comparator of the wheel speed sensor interface.

20 Claims, 8 Drawing Sheets

(56) References Cited

U.S. PATENT DOCUMENTS

| | | | |
|---|---|---|---|
| 6,491,357 B2 | 12/2002 | Holst | |
| 6,552,531 B1 | 4/2003 | Fey et al. | |
| 8,165,742 B2 * | 4/2012 | Wu | B60T 8/172 |
| | | | 701/29.1 |
| 9,720,024 B2 | 8/2017 | Alcouffe et al. | |
| 9,733,295 B2 | 8/2017 | Alcouffe et al. | |
| 2002/0074857 A1 * | 6/2002 | Babico | B60T 8/171 |
| | | | 303/199 |
| 2004/0066183 A1 * | 4/2004 | Lohberg | B60T 8/171 |
| | | | 324/166 |
| 2008/0246465 A1 | 10/2008 | Butzmann | |
| 2011/0215796 A1 * | 9/2011 | Le Goff | G01D 5/24476 |
| | | | 324/207.11 |
| 2014/0009201 A1 | 1/2014 | Wang et al. | |

FOREIGN PATENT DOCUMENTS

| | | |
|---|---|---|
| WO | 0242133 A1 | 5/2002 |
| WO | 2009/087504 A1 | 7/2009 |
| WO | 2017/016319 A1 | 2/2017 |

* cited by examiner

SENSOR CIRCUIT COMPENSATION FOR SUPPLY VOLTAGE TRANSIENTS

FIELD

The present disclosure relates in general to a sensor circuit, and in particular, to compensating for supply voltage transients in a sensor circuit.

BACKGROUND

In automotive vehicle control systems, it is known to use wheel speed sensors to obtain and utilize wheel speed information for use in controlling functions, such as those within an anti-lock brake system ("ABS"), a traction control system, an electronic stability control system, a predictive emergency braking system, and variable assist power steering and variable ride height systems. A wheel speed sensor is a type of tachometer. It is a sensor device used for reading the speed of a vehicle's wheel rotation. An ABS wheel speed sensor system measures a speed of a vehicle's wheels and converts an analog sensor signal to a digital signal for processing by an ABS controller. The ABS controller monitors and compares speed information from all sensed wheels. If the signal from one wheel changes abruptly with respect to the other wheels, the ABS controller determines that the wheel is beginning to lose traction. It can then take appropriate action by applying the brakes or performing traction control.

A typical wheel speed sensor has two main components: the exciter and the pickup. The exciter is a ring with notched teeth. This component is known by several names: sensor ring, tooth wheel, tone ring, and exciter. The pickup is commonly called "the sensor." It is configured to generate pulses of electricity as the teeth of the exciter pass in front of it. A central controller uses the pulses to determine wheel speeds and rates of acceleration/deceleration.

For example, during braking, the ABS controller uses voltage pulses from each wheel speed sensor to determine wheel speed changes. If the ABS controller determines that the pulse rate of the sensed wheels indicates imminent lock-up, it cycles an ABS modulator to modify brake pressure as needed to provide the best braking possible.

As is typical with electrical systems implemented within vehicles, power is supplied via the vehicle battery. However, the vehicle battery, and its associated electrical system (including an alternator/regulator system), operate under very harsh conditions, which can result in the occurrence of various transients occurring within the voltage supplied by the battery. The transients on an automobile power supply can range from severe, high energy, transients generated by the alternator/regulator system, to low-level "noise" generated by the ignition system and various accessories. A standard automotive electrical system has all of these elements necessary to generate undesirable transients. The severest transients can result from either a load dump condition or a jump start overvoltage condition. Other transients may also result from relays or solenoids switching on and off, and from fuses opening. The load dump overvoltage may be the most formidable transient encountered in an automotive environment. It is an exponentially decaying positive voltage that occurs in the event of a battery disconnect while the alternator is still generating charging current with other loads remaining on the alternator circuit at the time of battery disconnect. Such a load dump overvoltage may be caused by a battery disconnect resulting from cable corrosion, poor connection, or an intentional battery disconnect while the car is still running. Voltage spikes from 25 volts ("V") to 125V can easily be generated, and may last anywhere from 40 milliseconds ("ms") to 400 ms. Other transients can be caused by a spike induced by operation of the engine, a failed voltage regulator, jump starts with a 24V battery, a load dump disconnection of the battery while experiencing a high charging event, an inductive-load switching transient, a field decay in the alternator, a voltage pulse during ignition of the engine, mutual coupling in the harness, or noise generated in an accessory receiving power from the vehicle battery.

A problem with such transients (voltage spikes) is that they can cause an output of incorrect wheel speed information from one or more of the wheel sensors. For example, voltage spikes can result in the generation of incorrect voltage pulses, which can adversely affect the operation of one or more of the previously mentioned functions designed to enhance the safety of the vehicle, such as an ABS.

DETAILED DESCRIPTION

Aspects of the present disclosure compensate for the occurrence of transients (e.g., voltage spikes) in a supply voltage for a wheel speed sensor so that the output of the wheel speed sensor circuit is an accurate representation of the wheel speed detected by the wheel speed sensor. Since such transients can generate an extra current within the wheel speed sensor circuit, the output of the wheel speed sensor circuit may be corrupted or erroneous. Aspects of the present disclosure detect the occurrence of such transients and then inject a current signal that compensates for the generated extra current resulting from the transient.

Although some examples of embodiments of the present disclosure are described with reference to wheel speed sensors in a wheel speed sensor circuit, this is one application that may benefit from embodiments of the present disclosure. In other example embodiments, aspects of the present disclosure may be applied to any sensor circuit that requires compensation of a transient in a source voltage (e.g., a voltage spike).

Figure 1:
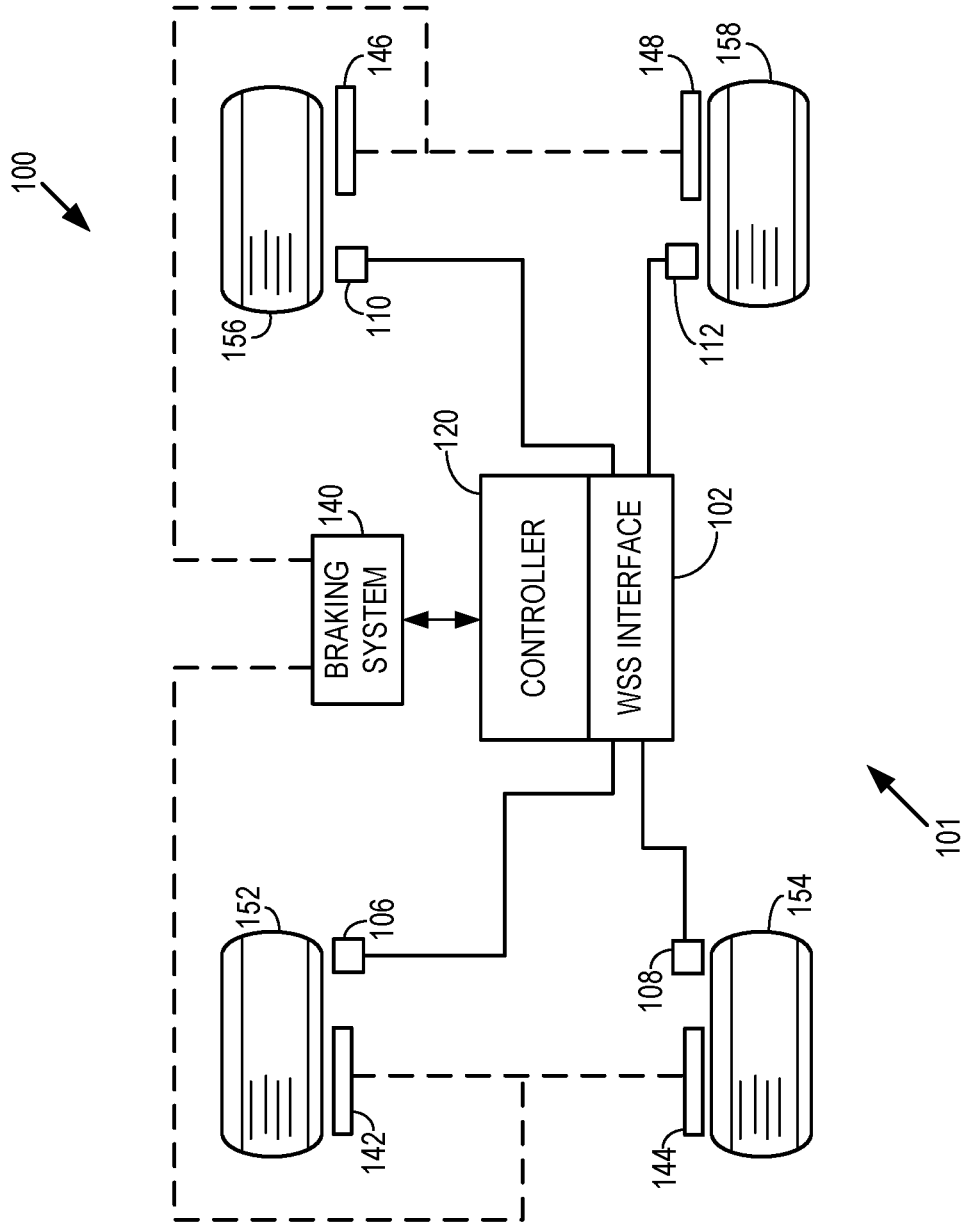
FIG. 1 illustrates a simplified schematic diagram of a vehicle configured in accordance with embodiments of the present disclosure.

FIG. 1 illustrates an example of a vehicle 100 (portions of the vehicle 100 are omitted from FIG. 1 for the sake of simplicity) with a wheel speed sensor circuit 101, for example for use in an anti-lock braking system ("ABS"). The wheel speed sensor circuit 101 measures a speed of one or more of each of the vehicle's wheels 152, 154, 156, 158. The exemplary wheel speed sensor circuit 101 of the vehicle 100 includes a number of individual sensors 106, 108, 110, 112. The wheel speed sensor circuit 101 may include interface circuits co-located with each of the sensors 106, 108, 110, 112, or the interface circuits may be centralized, such as shown in FIG. 1 with wheel speed sensor ("WSS") interface 102.

In an exemplary operation, a controller 120 monitors and compares speed information from the wheels 152, 154, 156, 158 via the individual wheel speed sensors 106, 108, 110, 112. If a signal from one wheel speed sensor changes abruptly with respect to the other wheels, the controller 120 determines that the wheel is beginning to lose traction. The controller 120 can then take the appropriate action by applying pressure to any one or more of the braking elements 142, 144, 146, 148 or a traction control system via, for example, a control signal sent to the braking system 140. Thus, in this example, the braking system 140 is also operably coupled to each of the braking elements 142, 144, 146, 148 of each of the wheels 152, 154, 156, 158 and arranged to control the braking of each wheel according to one or more respective control signal(s) received from the controller 120.

Two basic types of wheel speed sensors include magnetic sensors and Hall Effect sensors. As is well-known in the art, a vehicle 100 may include a number of gear-shaped rotors (not shown) operably coupled to a respective individual wheel speed sensor 106, 108, 110, and 112 located at each of the wheels 152, 154, 156, and 158, respectively. Each gear-shaped rotor spins at a frequency that is substantially proportional (or equal) to a rotation of a wheel attached to the gear-shaped rotor. In an example, each individual wheel speed sensor 106, 108, 110, 112 may include a permanent magnet with a coil wrapped around it, which acts as a magnetic pickup that reads a position of the teeth on the gear-shaped rotor. When a tooth passes the iron core, the magnetic lines of force cut through the coil windings causing a positive voltage to be induced on the coil. When the tooth is centered on the iron core the magnetic field does not move and zero volts are induced on the coil. As the tooth moves away from the iron core the magnetic field expands, resulting in a negative voltage. As the rotation speed of the gear-shaped rotor increases, the voltage and frequency of the signal also increase, thereby indicating a faster wheel speed to the WSS interface 102. In accordance with embodiments of the present disclosure, each of the wheel speed sensors 106, 108, 110, 112 may be configured to output currents of two nominal levels (for example, 7 mA or 14 mA for a Type 2 sensor) or three nominal levels (for example, 7 mA or 14 mA or 28 mA for a Type 1 sensor), in a pulsed manner.

Thus, in this example, each of the number of individual sensors 106, 108, 110, 112 may be operable to generate a current waveform that is representative of a position of a toothed wheel operably coupled to a wheel (e.g., wheels 152, 154, 156, and 158) of a moving vehicle. In some other examples, at least two of the sensors, for example individual sensors 106, 108, may be utilized, for a two-wheel drive vehicle. In some other examples, more than four sensors may be utilized for a vehicle with more than four wheels.

In this example, each individual sensor 106, 108, 110, 112 converts the magnetic signal into a rectangular pulse signal at a frequency according to the respective wheel speed. At each HIGH pulse, the individual sensor 106, 108, 110, 112 draws 14 mA from a supply voltage (e.g., a vehicle battery (referred to as $V_{BAT}$ herein)), whereas at each LOW pulse, 7 mA is drawn. The WSS interface 102 compares these current levels to, for example, a threshold level (e.g., 10 mA) in order to determine whether the output signal is in a HIGH state or in a LOW state. In accordance with embodiments of the present disclosure, a 10 mA threshold may be employed for a Type 2 sensor. In accordance with embodiments of the present disclosure, a 20 mA threshold may be employed for a Type 1 sensor.

In accordance with embodiments of the present disclosure, in addition to vehicle speed, other information may be transmitted by the controller 120, for example, dependent upon the types of sensors employed.

Figure 2A:
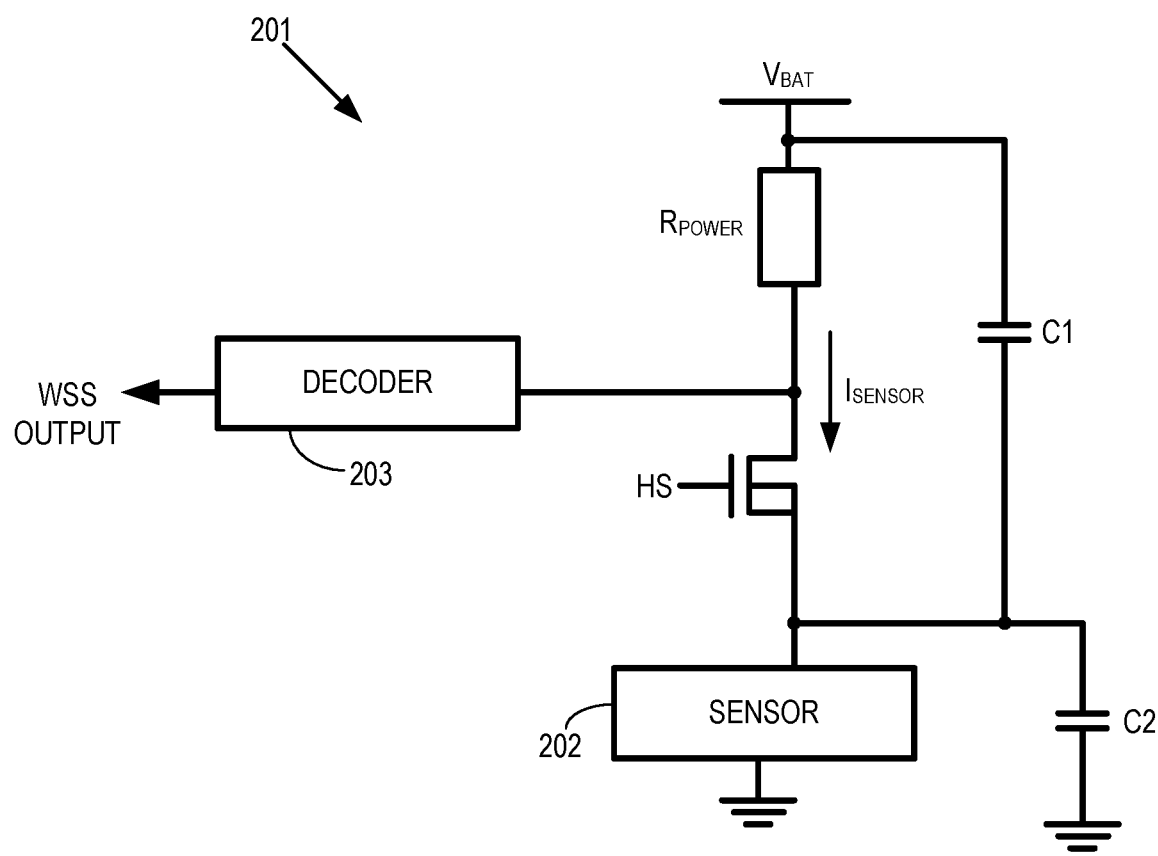
FIG. 2A illustrates a circuit diagram of a prior art wheel speed sensor interface.
Figure 2B:
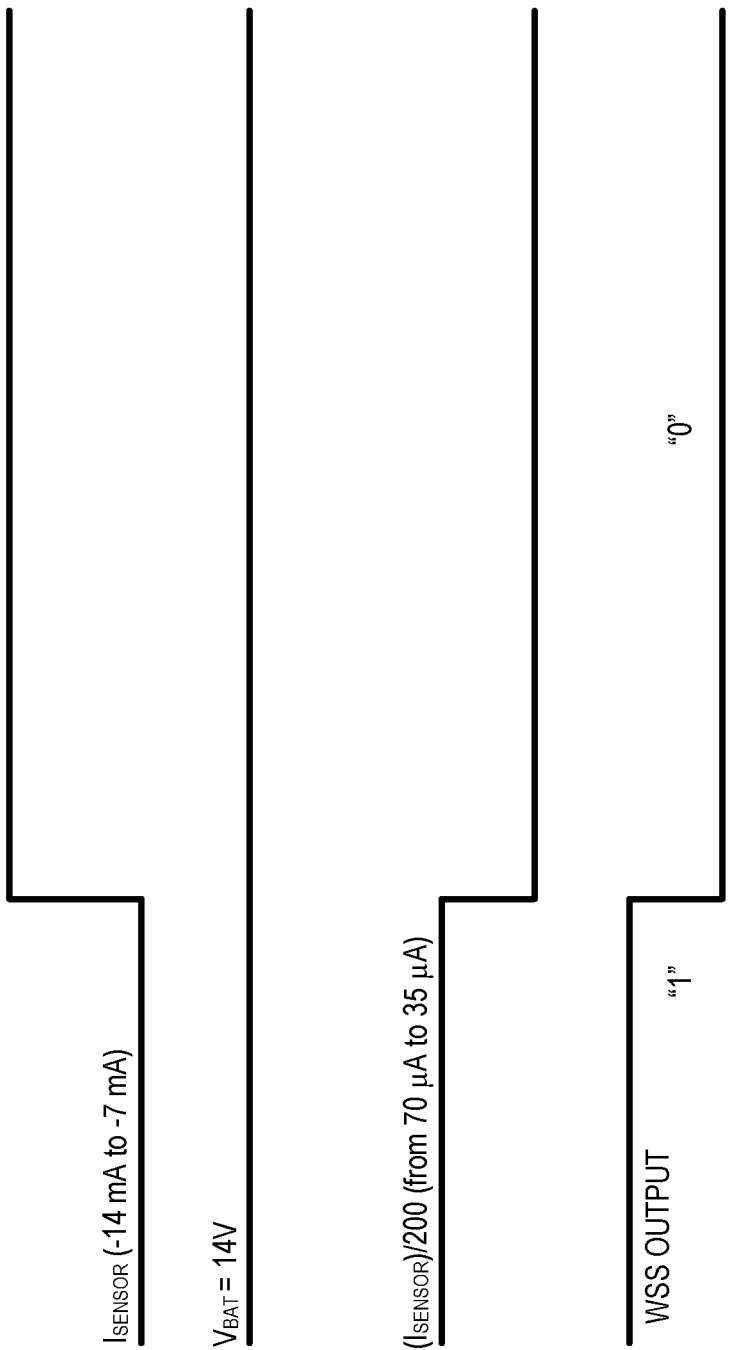
FIG. 2B illustrates a timing diagram of a normal operation of a wheel speed sensor interface.

Referring to FIGS. 2A and 2B, there is illustrated an example of an operation of a prior art wheel speed sensor interface 201 coupled to a wheel speed sensor 202. The wheel speed sensor 202 may be implemented within a vehicle similarly as the wheel speed sensors 106, 108, 110, 112. The wheel speed sensor 202 is powered by a supply voltage, $V_{BAT}$, from the vehicle's battery (not shown). A High Side ("HS") MOSFET is utilized with a resistive element $R_{POWER}$ to implement a current sensor coupled to the wheel speed sensor 202, producing the periodically pulsed current signal $I_{SENSOR}$, which may, for example, be configured to vary between −14 mA and −7 mA. A capacitor C1 may be implemented to filter out electromagnetic interference, which could originate from an electrostatic discharge pulse or other high frequency noise occurring elsewhere in the vehicle 100, or a voltage variation in the braking system 140 (e.g., the pump motor, valves, etc.). The capacitance C2 represents an input parasitic capacitance inherent in the wheel speed sensor 202.

As depicted in FIG. 2B, under normal operation when the voltage $V_{BAT}$ is substantially constant (i.e., no occurrence of any transients), the Decoder 203 correctly decodes the pulsed current signal $I_{SENSOR}$ to produce the WSS Output signal (e.g., as a pulsed digital signal between logical 1's and 0's). In accordance with embodiments of the present disclosure, the Decoder 203 may be configured with well-known circuitry (not shown) to reduce in magnitude the current signal $I_{SENSOR}$ by any desired predetermined magnitude (e.g., 200 thus producing a signal varying between 70 µA and 35 µA). However, when a HS MOSFET is utilized to drive a current sensor, the resultant circuitry is sensitive to the voltage supply (e.g., the voltage, $V_{BAT}$, supplied by a vehicle battery). Such a transient in the voltage supply can generate an erroneous decoding of the periodically pulsed current, $I_{SENSOR}$, through the high side measurement.

Figure 2C:
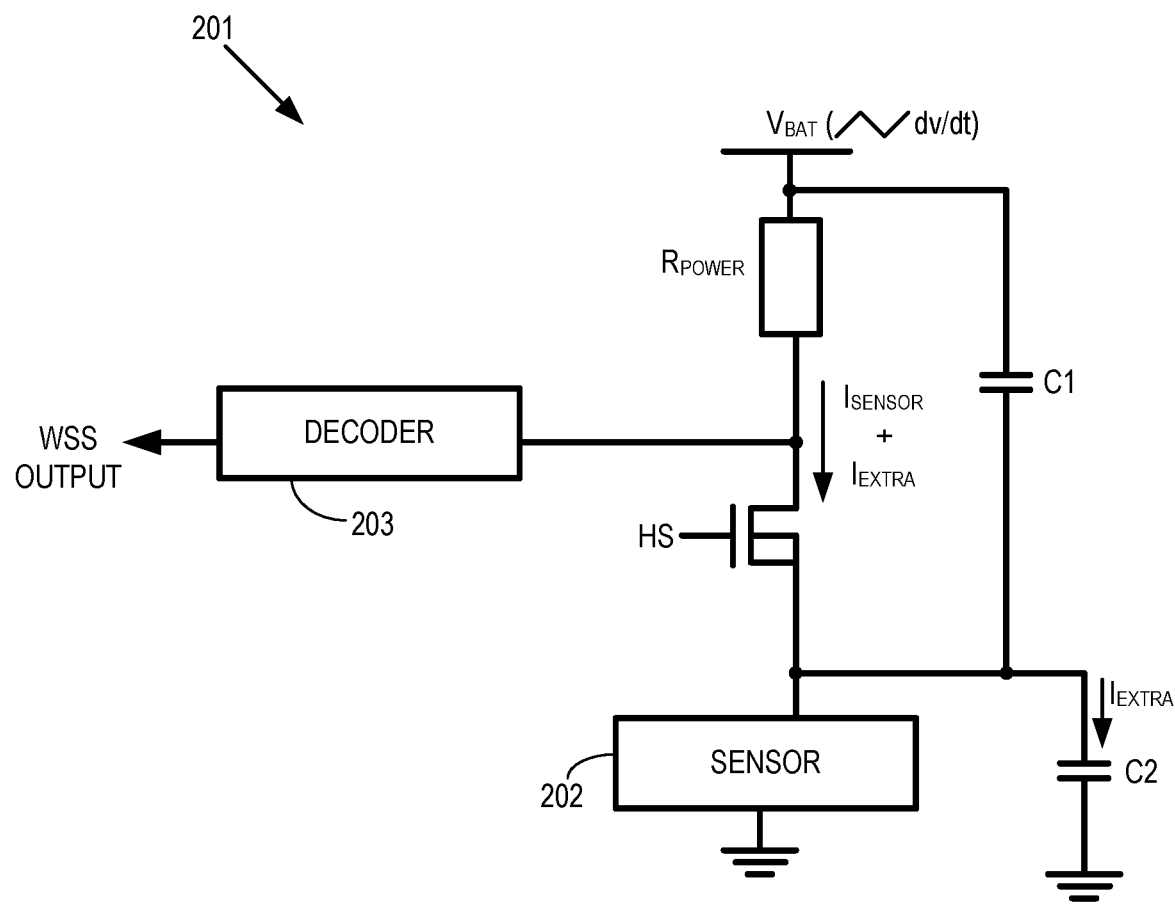
FIG. 2C illustrates current signals generated in the prior art wheel speed sensor interface of FIG. 2A resulting from a supply voltage transient.
Figure 2D:
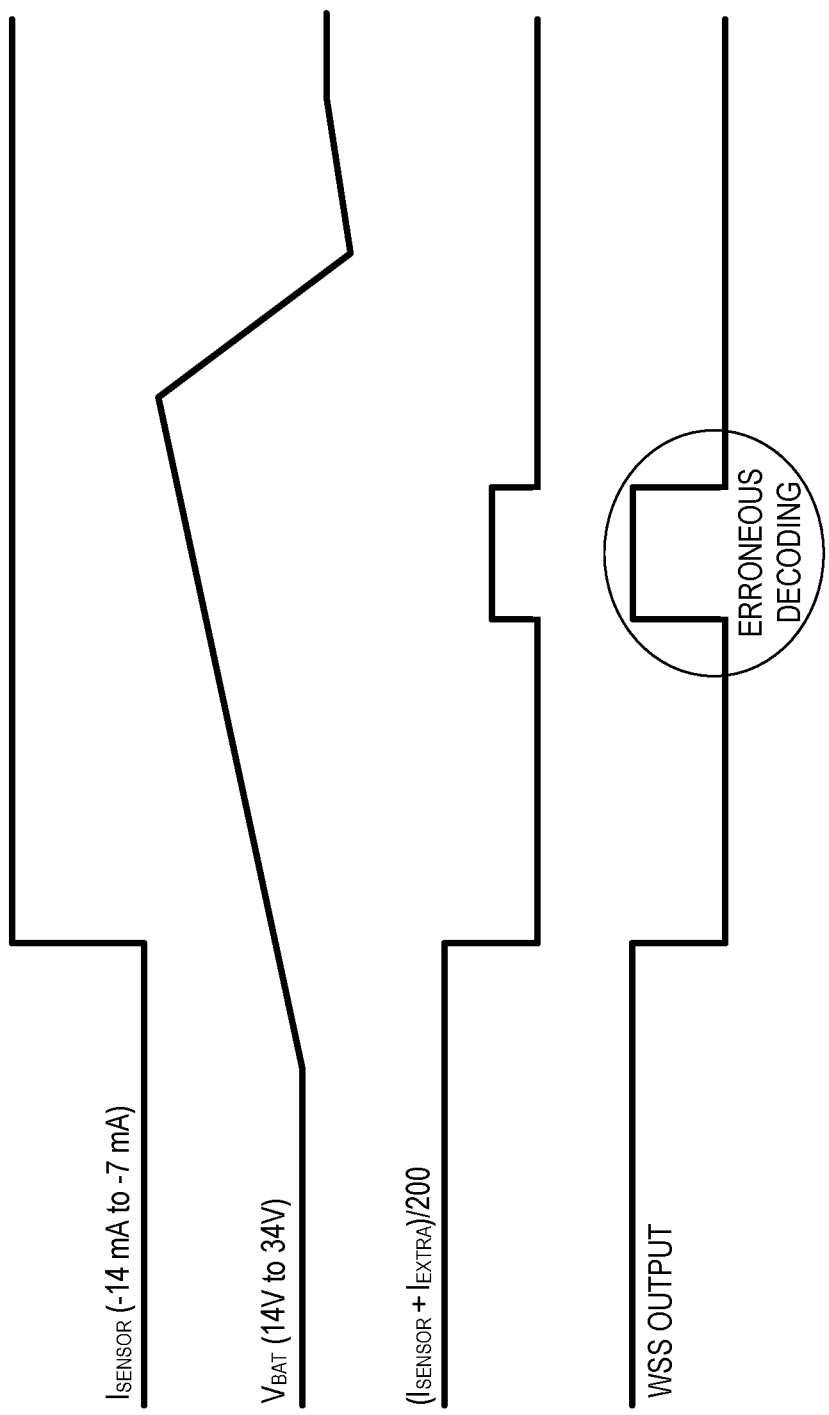
FIG. 2D illustrates a timing diagram of an operation of the prior art wheel speed sensor interface of FIG. 2A resulting from the current signals depicted in FIG. 2C.

FIGS. 2C and 2D demonstrate how such a prior art wheel speed sensor interface 201 is sensitive to transients occurring within the supply voltage $V_{BAT}$, which can result in an erroneous decoding by the Decoder 203. Consider, for example, an occurrence of a spike occurring in the voltage $V_{BAT}$ (e.g., from 14V to 34V as depicted in FIG. 2D). During the rising edge of this transient dv/dt, there is an additional charging within the capacitances in C1 and C2. This transient dv/dt causes an extra current $I_{EXTRA}$ to be generated in the input parasitic capacitance C2. This extra current $I_{EXTRA}$ is added to the sensor current $I_{SENSOR}$, which now flows through the HS MOSFET. As a result, the wheel speed sensor interface 201 not only measures $I_{SENSOR}$, but also $I_{EXTRA}$ (i.e., $I_{SENSOR}+I_{EXTRA}$).

As can be seen in FIG. 2D, this extra current, $I_{EXTRA}$, can result in an erroneous decoding by the Decoder 203 (e.g., an erroneous output of a logical 1). It can be readily appreciated that such an erroneous value in the wheel speed sensor ("WSS") Output signal can lead to an undesirable and/or erroneous functioning of any system within a vehicle that relies upon such signals, such as an erroneous functioning of an ABS.

As will be described with respect to FIGS. 3A-3C, embodiments of the present disclosure are configured to detect and compensate for such transients in the supply voltage so that the values of the WSS Output signal are an accurate representation of a rotational speed of a wheel (e.g., the wheels 152, 154, 156, 158) associated with a wheel speed sensor (e.g., the wheel speed sensors 106, 108, 110, 112). In other words, the wheel speed sensor interface 301 is configured to be substantially insensitive to supply voltage transients by compensating the sensor current resulting from an induced transient (i.e., $I_{SENSOR}+I_{EXTRA}$) in proportion to the transient voltage dv/dt. In accordance with embodiments of the present disclosure, a wheel speed sensor interface 301 may be implemented to sense the speed of each of the wheels 152, 154, 156, 158.

Figure 3A:
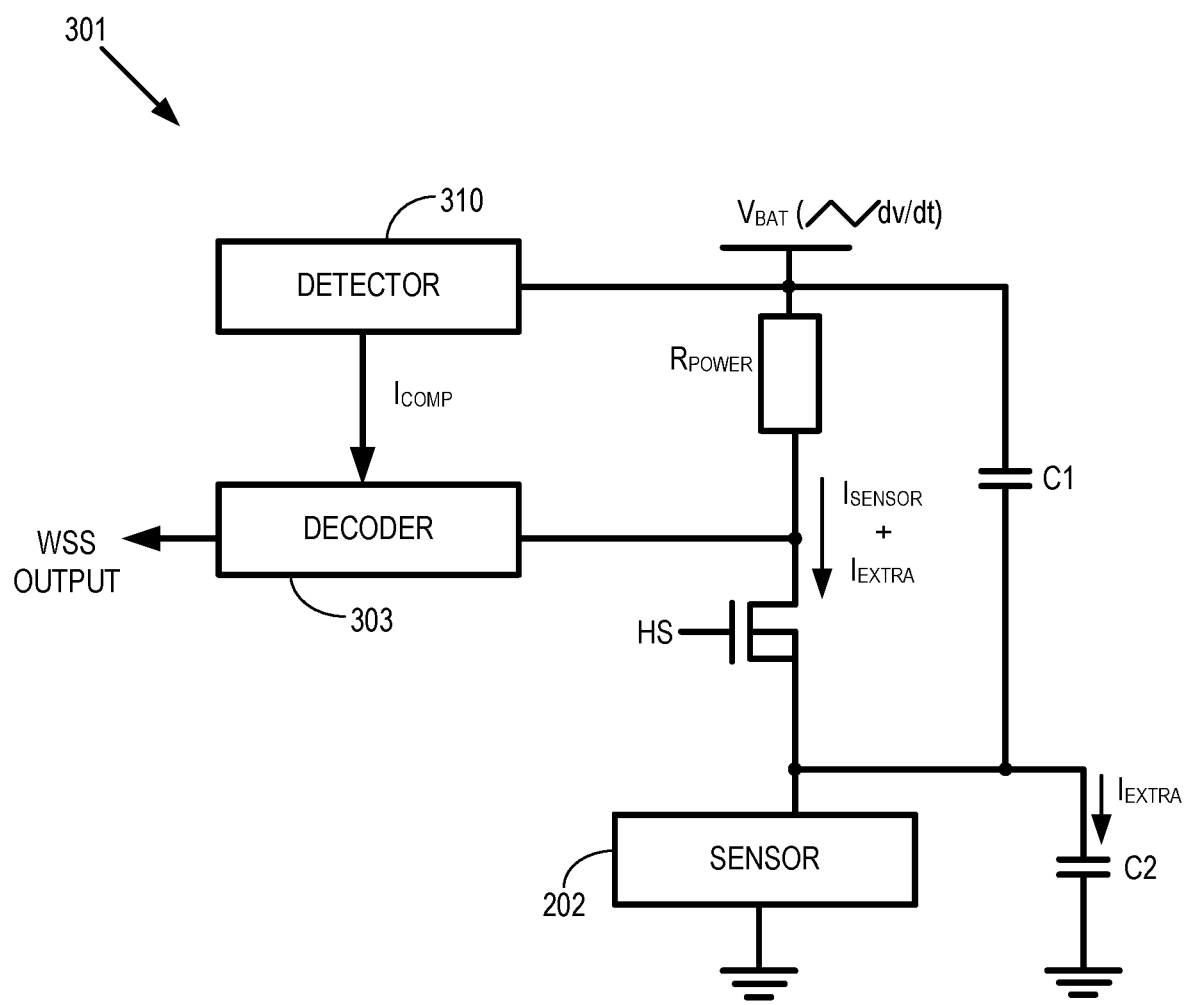
FIG. 3A illustrates a circuit diagram of a wheel speed sensor interface configured in accordance with embodiments of the present disclosure, including current signals generated in the wheel speed sensor interface resulting from a supply voltage transient.

FIG. 3A illustrates a simplified diagram of a wheel speed sensor interface 301 configured in accordance with embodiments of the present disclosure. When the supply voltage is substantially stable (i.e., no occurrence of a voltage transient), the wheel speed sensor interface 301 will operate in a manner as similarly described with respect to FIG. 2B. However, when a transient in the supply voltage does occur, resulting in a sensed current of $I_{SENSOR}+I_{EXTRA}$ as previously described with respect to FIGS. 2C-2D, a Detector circuit 310 is configured to detect the occurrences of such transients and to compensate for them so that the transients do not adversely affect the values of the WSS Output signal produced by the Decoder 303. The detector circuit 310 accomplishes this by injecting a compensation signal, $I_{COMP}$, into the Decoder 303.

Figure 3B:
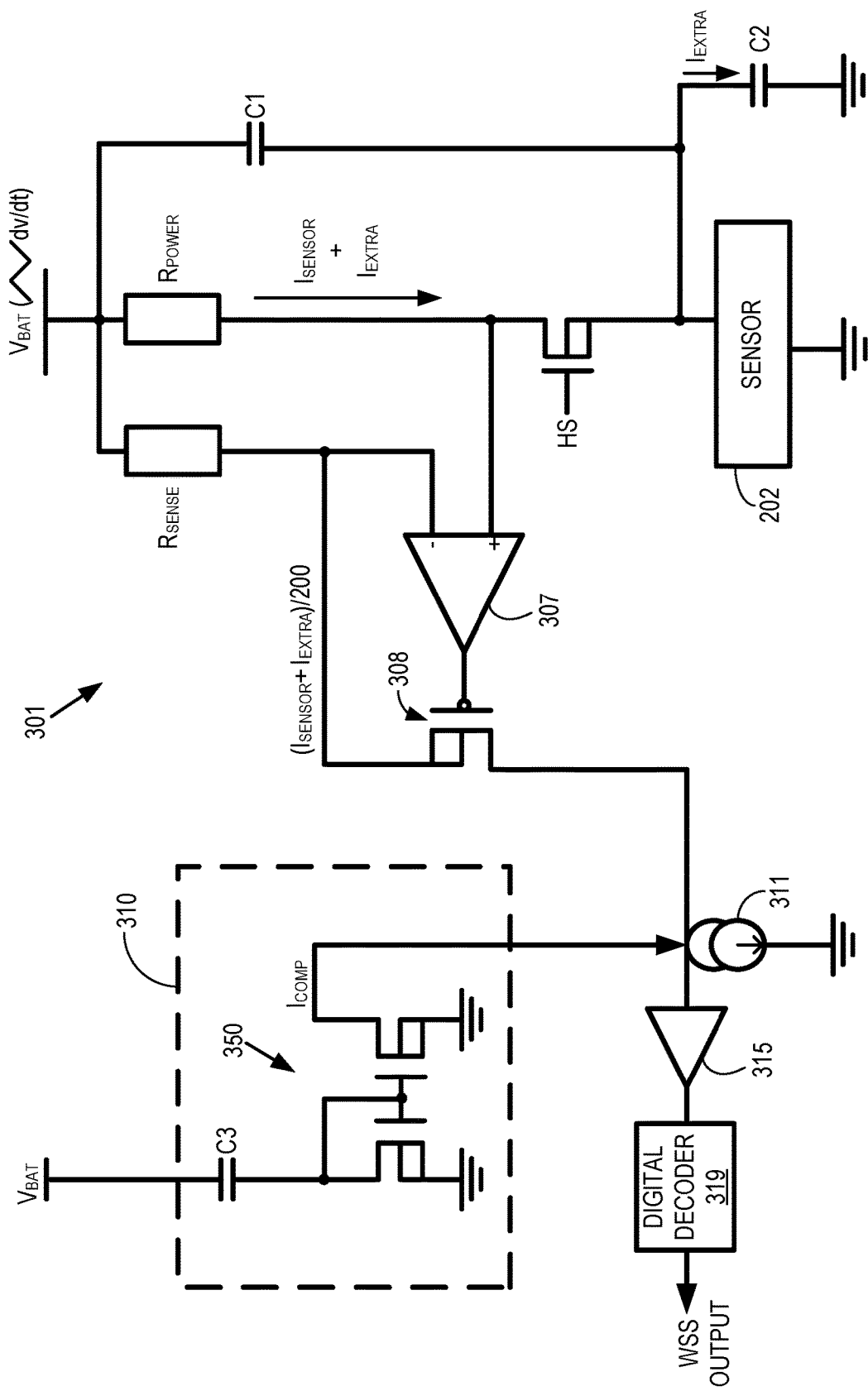
FIG. 3B illustrates a more detailed circuit diagram of the wheel speed sensor interface of FIG. 3A.

FIG. 3B illustrates a more detailed diagram of the wheel speed sensor interface 301 configured in accordance with embodiments of the present disclosure. A resistive element $R_{SENSE}$ may be implemented to reduce the current $I_{SENSOR}$ or $I_{SENSOR}+I_{EXTRA}$ as the case may be, by a specified amount (e.g., by a magnitude of 200 as described herein with respect to the non-limiting example of FIGS. 3A-3C) so that elements of the Decoder 303 and the Detector circuit 310 can be implemented with lower power circuitry, such as within an integrated circuit. As indicated in FIG. 3C, the sensor current, $I_{SENSOR}$, may be configured to vary between two values during normal operation of the wheel speed sensor (e.g., −14 mA and −7 mA), which is converted by the Decoder 303 into a digital signal (WSS Output) varying between logical 1's and 0's that correspond to the varying sensor current.

When a transient dv/dt occurs in the supply voltage, $V_{BAT}$ (e.g., a spike in the supply voltage, $V_{BAT}$, increasing from a normal operating voltage (e.g., 14V) to a higher voltage (e.g., 34V)), the resultant sensor current $I_{SENSOR}+I_{EXTRA}$, which may be reduced by a specified magnitude (e.g., $(I_{SENSOR}+I_{EXTRA})/200$) is produced by the combination of the amplifier 307 and the PFET 308, and received by the Digital Decoder 319 for decoding into a pulsed signal of logical 1's and 0's as the WSS Output signal that represents the speed of the wheel associated with the wheel speed sensor 202. However, because of the occurrence of the transient dv/dt, the extra current, $I_{EXTRA}$, could cause an erroneous value in the WSS Output signal, such as previously described with respect to FIG. 2D.

Figure 3C:
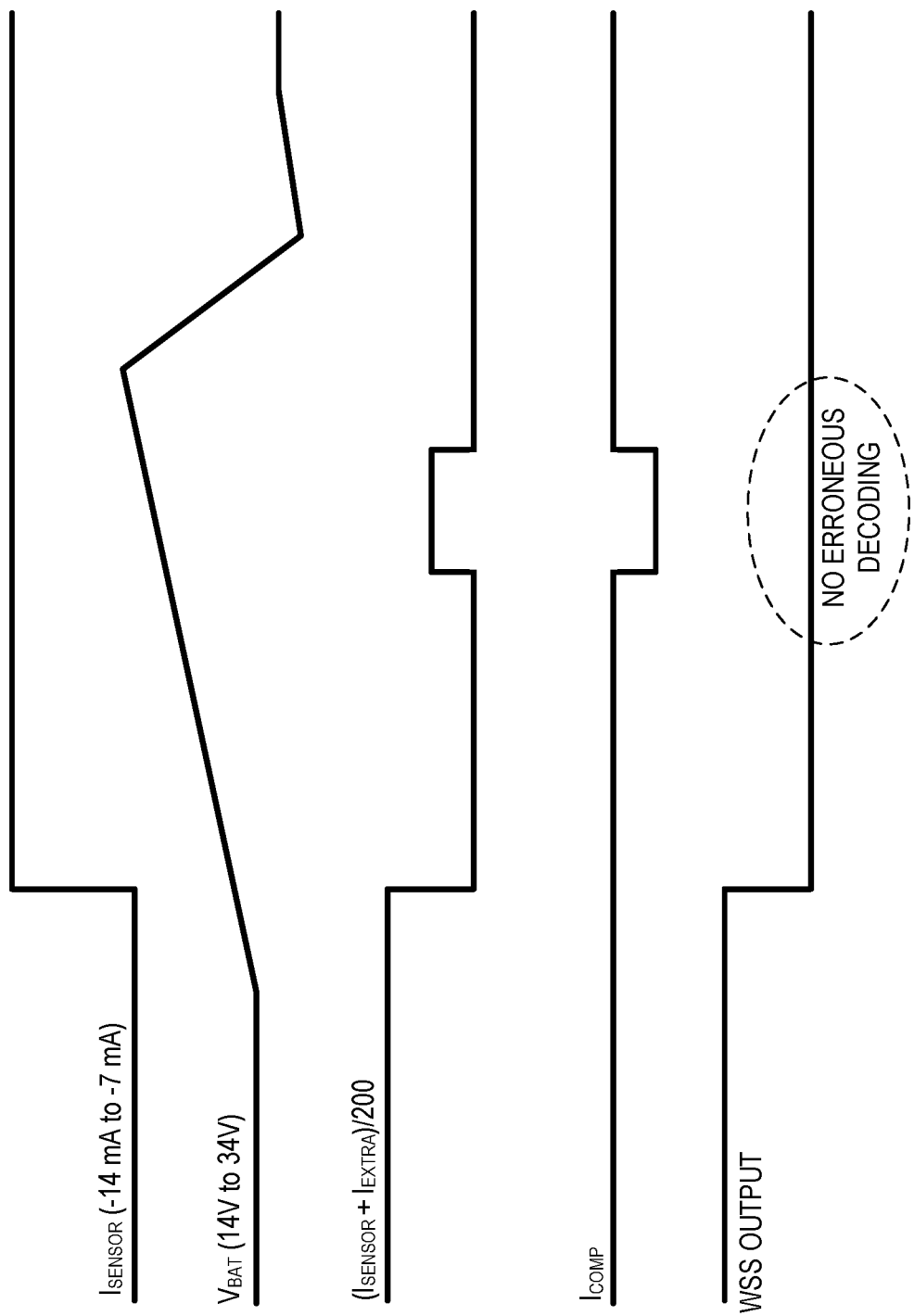
FIG. 3C illustrates a timing diagram of an operation of the wheel speed sensor interface of FIG. 3A resulting from the current signals depicted in FIG. 3B.

Referring to FIGS. 3B and 3C, the Detector circuit 310 is configured to receive the supply voltage, $V_{BAT}$. The supply voltage, $V_{BAT}$, may pass through a capacitor C3 (which may be configured to emulate the parasitic capacitance C2) to be received by a current mirror 350, which is configured to mirror the extra current, $I_{EXTRA}$, to produce a compensation current, $I_{COMP}$. In other words, the Detector circuit 310 is configured to produce a compensation current, $I_{COMP}$, that is proportional to the extra current, $I_{EXTRA}$, produced as a result of the transient dv/dt in the supply voltage, $V_{BAT}$, since the Detector circuit 310 is also coupled to the supply voltage, $V_{BAT}$. The Detector circuit 310 may be configured to set the compensation current, $I_{COMP}$, using the capacitance of C3 and the ratio of the circuit elements in the current mirror 350.

The compensation current, $I_{COMP}$, is injected by the Detector circuit 310 into the current comparator 311 of the Decoder 303. Note that, in accordance with embodiments of the present disclosure, if the wheel speed sensor interface 301 is implemented to reduce in scale the magnitude of the current, $I_{SENSOR}$, by a predetermined magnitude (e.g., 200), then the capacitance of C3 and the circuitry elements in the current mirror 350 will be configured so that $I_{COMP}$ is reduced accordingly by the same magnitude. In the example illustrated in FIG. 3C, the addition of $I_{COMP}$ into the current comparator 311 results in the combined current of $((I_{SENSOR}+I_{EXTRA})/200)+I_{COMP}$, where $I_{COMP}=(I_{EXTRA}/200)$. The additional compensation current, $I_{COMP}$, is configured to compensate for the extra current, $I_{EXTRA}$, so that the output logical signal, WSS Output, is not adversely affected by the transient in the voltage supply, $V_{BAT}$. As depicted in FIG. 3C, as a result of this compensation, the WSS Output signal accurately represents the wheel speed detected by the wheel speed sensor 202 (as represented by the current signal, $I_{SENSOR}$).

The current mirror 350 is depicted in FIG. 3B as MOSFETs coupled in a back-to-back manner as is well-known in the art. However, embodiments of the present disclosure may be utilized with any circuitry suitably configured to produce such a compensation current, $I_{COMP}$, in a manner as described herein. Moreover, the Detector circuit 310 may be implemented as integrated circuitry or as discrete components.

In accordance with certain embodiments of the present disclosure, the current mirror may be configured to be a trimmable current mirror so that the output current, $I_{COMP}$, can be adjusted as desired. For example, adjustments can be made to the output current, $I_{COMP}$, in order to configure the Detector circuit 310 to vary a value of $I_{COMP}$ to thereby compensate for certain various different types of transients occurring with the supply voltage, $V_{BAT}$. Such a trimmable current mirror may be implemented in any manner well-known in the art.

Aspects of the present disclosure provide for a wheel speed sensor interface that includes circuitry configured to receive an analog signal from a wheel speed sensor, a decoder configured to convert the analog signal received from the wheel speed sensor to a digital wheel speed sensor output signal, and a detector circuit configured to (1) detect a transient occurring within a voltage source powering the wheel speed sensor, and (2) compensate the digital wheel speed sensor output signal as a function of the detection of the transient occurring within the voltage source powering the wheel speed sensor. The detector circuit may be configured to compensate the digital wheel speed sensor output signal so that it is an accurate representation of a wheel speed detected by the wheel speed sensor. The detector circuit may be configured to compensate the digital wheel speed sensor output signal so that a value of the digital wheel speed sensor output signal is not modified by the transient occurring within the voltage source powering the wheel speed sensor. The transient may be a spike in a voltage level supplied to the wheel speed sensor. The detector circuit may include a current mirror coupled to the voltage source, wherein the current mirror is configured to emulate an extra current produced within the wheel speed sensor caused by the transient. An output of the current mirror may be combined with the analog signal. The decoder may include an operational amplifier having a first input coupled to a first resistive element of the wheel speed sensor, and a second input coupled to the voltage source via a second resistive element, and a PFET having a gate electrode coupled to an output of the operational amplifier, a source electrode coupled to the second input of the operational amplifier, and a drain electrode coupled to a current comparator, wherein the detector circuit includes a trimmable current mirror coupled to the voltage source, wherein an output of the trimmable current mirror is coupled to a current comparator of the decoder.

Aspects of the present disclosure provide for a method for detecting and compensating for a transient in a voltage signal supplying a sensor circuit, wherein the method includes producing an analog signal representing a varying output of the sensor circuit, detecting an occurrence of the transient in the voltage signal supplying the sensor circuit, compensating the analog signal as a function of the detection of the transient occurring within the voltage signal supplying the sensor circuit, and converting the compensated analog signal into a digital output signal. The digital output signal may be compensated so that it is an accurate representation of the analog signal outputted by the sensor circuit. The digital output signal may be compensated so that a value of the digital output signal is not modified by the transient occurring within the voltage signal supplying the sensor circuit. The transient may be a spike in a voltage signal supplied to the sensor circuit. In accordance with embodiments of the present disclosure, the sensor circuit is a vehicle wheel speed sensor, wherein the digital output signal is compensated so that it is an accurate representation of a wheel speed detected by the wheel speed sensor.

Aspects of the present disclosure provide for a vehicle that includes a wheel speed sensor configured to detect a wheel speed of a wheel associated with the wheel speed sensor, circuitry configured to receive an analog signal from the wheel speed sensor, a decoder configured to convert the analog signal received from the wheel speed sensor to a digital wheel speed sensor output signal, and a detector circuit configured to (1) detect a transient occurring within a voltage source powering the wheel speed sensor, and (2) compensate the digital wheel speed sensor output signal as a function of the detection of the transient occurring within the voltage source powering the wheel speed sensor. The detector circuit may be configured to compensate the digital wheel speed sensor output signal so that it is an accurate representation of the wheel speed detected by the wheel speed sensor. The detector circuit may be configured to compensate the digital wheel speed sensor output signal so that a value of the digital wheel speed sensor output signal is not modified by the transient occurring within the voltage source powering the wheel speed sensor. The transient may be a spike in a voltage level supplied to the wheel speed sensor. The detector circuit may include a current mirror coupled to the voltage source, wherein the current mirror is configured to emulate an extra current produced within the wheel speed sensor caused by the transient. An output of the current mirror may be combined with the analog signal. The vehicle may further include a braking system including a braking element configured to decrease the wheel speed of the wheel, and a controller configured to receive the digital wheel speed sensor output signal and signal the braking system to activate the braking element. The controller may include an anti-lock brake system.

While these exemplary embodiments are described in sufficient detail to enable those skilled in the art to practice embodiments of the present disclosure, it should be understood that other embodiments may be realized and that various changes to the disclosure may be made without departing from the spirit and scope of the present disclosure.

As used herein, the singular forms "a," "an," and "the" include plural referents unless the context clearly dictates otherwise.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a defacto equivalent of any other member of the same list solely based on their presentation in a common group without indications to the contrary.

Any steps recited in any method or process claims may be executed in any order and are not limited to the order presented in the claims. Means-plus-function or step-plus function limitations will only be employed where for a specific claim limitation all of the following conditions are present in that limitation: a) "means for" or "step for" is expressly recited; and b) a corresponding function is expressly recited. The structure, material, or acts that support the means-plus function are expressly recited in the description herein.

Unless defined otherwise, all technical and scientific terms used herein have the same meaning as commonly understood to one of ordinary skill in the art to which the presently disclosed subject matter belongs.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. A wheel speed sensor interface comprising:
   circuitry configured to receive an analog signal from a wheel speed sensor;
   a decoder configured to convert the analog signal received from the wheel speed sensor to a digital wheel speed sensor output signal; and
   a detector circuit configured to (1) detect a transient occurring within a voltage source powering the wheel speed sensor, and (2) compensate the digital wheel speed sensor output signal as a function of the detection of the transient occurring within the voltage source powering the wheel speed sensor;
   wherein the analog signal is indicative of a sensor current; and wherein detector circuit configured to compensate the digital wheel speed sensor output signal comprises the detector circuit configured to compensate the digital wheel speed sensor output signal by adjusting a magnitude of the analog signal by a magnitude of an extra current produced within the wheel speed sensor during the transient prior to the decoder converting the analog signal to the digital wheel speed sensor output, wherein the detector emulates the magnitude of the extra current by passing a voltage of the voltage source through a detector capacitor which is configured to emulate a parasitic capacitance of the wheel speed sensor in which the extra current is generated.

2. The wheel speed sensor interface as recited in claim 1, wherein the compensated digital wheel speed sensor output signal indicates a wheel speed during the transient.

3. The wheel speed sensor interface as recited in claim 1, wherein the detector circuit is configured to compensate the digital wheel speed sensor output signal so that a value of the digital wheel speed sensor output signal is not modified by the transient occurring within the voltage source powering the wheel speed sensor.

4. The wheel speed sensor interface as recited in claim 1, wherein the transient is a spike in a voltage level supplied to the wheel speed sensor.

5. The wheel speed sensor interface as recited in claim 1, wherein the detector circuit comprises a current mirror coupled to the voltage source, wherein the current mirror is configured to emulate an extra current produced within the wheel speed sensor caused by the transient.

6. The wheel speed sensor interface as recited in claim 5, wherein an output of the current mirror is combined with the analog signal.

7. The wheel speed sensor interface as recited in claim 1, wherein the decoder comprises:
an operational amplifier having a first input coupled to a first resistive element of the wheel speed sensor, and a second input coupled to the voltage source via a second resistive element; and
a PFET having a gate electrode coupled to an output of the operational amplifier, a source electrode coupled to the second input of the operational amplifier, and a drain electrode coupled to a current comparator, wherein the detector circuit comprises a trimmable current mirror coupled to the voltage source, wherein an output of the trimmable current mirror is coupled to a current comparator of the decoder.

8. A method for detecting and compensating for a transient in a voltage signal supplying a sensor circuit, the method comprising:
producing an analog signal representing a varying output of the sensor circuit;
detecting an occurrence of the transient in the voltage signal supplying the sensor circuit;
compensating the analog signal as a function of the detection of the transient occurring within the voltage signal supplying the sensor circuit; and
converting the compensated analog signal into a digital output signal;
wherein the analog signal representing the varying output of the sensor circuit is a varying sensor current output of the sensor circuit; and wherein compensating the analog signal comprises compensating the analog signal by adjusting a magnitude of the analog signal by a magnitude of an extra current produced within the wheel speed sensor during the transient, the method further comprising emulating the magnitude of the extra current by passing a voltage of the voltage source through a capacitor which is configured to emulate a parasitic capacitance of the wheel speed sensor in which the extra current is generated.

9. The method as recited in claim 8, wherein the digital output signal is a representation of the analog signal outputted by the sensor circuit during the transient.

10. The method as recited in claim 8, wherein the digital output signal is compensated so that a value of the digital output signal is not modified by the transient occurring within the voltage signal supplying the sensor circuit.

11. The method as recited in claim 8, wherein the transient is a spike in a voltage signal supplied to the sensor circuit.

12. The method as recited in claim 8, wherein the sensor circuit is a vehicle wheel speed sensor, wherein the digital output signal is a representation of a wheel speed during the transient.

13. A vehicle comprising:
a wheel speed sensor configured to detect a wheel speed of a wheel associated with the wheel speed sensor;
circuitry configured to receive an analog signal from the wheel speed sensor;
a decoder configured to convert the analog signal received from the wheel speed sensor to a digital wheel speed sensor output signal; and
a detector circuit configured to (1) detect a transient occurring within a voltage source powering the wheel speed sensor, and (2) compensate the digital wheel speed sensor output signal as a function of the detection of the transient occurring within the voltage source powering the wheel speed sensor;
wherein the analog signal is indicative of a sensor current; and
wherein the detector circuit configured to compensate the digital wheel speed sensor output comprises the detector circuit configured to compensate the digital wheel speed sensor output signal by adjusting a magnitude of the analog signal by a magnitude of an extra current produced within the wheel speed sensor during the transient prior to the decoder converting the analog signal to the digital wheel speed sensor output, wherein the detector circuit emulates the magnitude of the extra current by passing a voltage of the voltage source through a detector capacitor which is configured to emulate a parasitic capacitance of the wheel speed sensor in which the extra current is generated.

14. The vehicle as recited in claim 13, wherein the compensated digital wheel speed sensor output signal indicates the wheel speed during the transient.

15. The vehicle as recited in claim 13, wherein the detector circuit is configured to compensate the digital wheel speed sensor output signal so that a value of the digital wheel speed sensor output signal is not modified by the transient occurring within the voltage source powering the wheel speed sensor.

16. The vehicle as recited in claim 13, wherein the transient is a spike in a voltage level supplied to the wheel speed sensor.

17. The vehicle as recited in claim 13, wherein the detector circuit comprises a current mirror coupled to the voltage source, wherein the current mirror is configured to only mirror an emulation of an extra current produced within the wheel speed sensor caused by the transient.

18. The vehicle as recited in claim 17, wherein an output of the current mirror is combined with the analog signal.

19. The vehicle as recited in claim 17, further comprising:
a braking system comprising a braking element configured to decrease the wheel speed of the wheel; and a controller configured to receive the digital wheel speed sensor output signal and signal the braking system to activate the braking element.

20. The vehicle as recited in claim 19, wherein the controller comprises an anti-lock brake system.

* * * * *